United States Patent [19]

von Gentzkow et al.

[11] Patent Number: 4,604,314

[45] Date of Patent: Aug. 5, 1986

[54] PRINTED CIRCUIT BOARDS OF LAMINATED THERMOSETTING SHEETS

[75] Inventors: Wolfgang von Gentzkow, Kleinsendelbach; Maximilian Hödl, Munich; Wolfgang Kleeberg, Erlangen; Helmut Markert, Nuremberg, all of Fed. Rep. of Germany

[73] Assignee: Siemens Aktiengesellschaft, Munich, Fed. Rep. of Germany

[21] Appl. No.: 694,776

[22] Filed: Jan. 25, 1985

[30] Foreign Application Priority Data

Jan. 27, 1984 [DE] Fed. Rep. of Germany ....... 3402883

[51] Int. Cl.$^4$ .......................... C08K 5/25; C08L 63/00
[52] U.S. Cl. ..................... 428/209; 428/210; 428/268; 428/273; 428/285; 428/418; 523/455; 525/486; 528/93
[58] Field of Search ............... 428/209, 210, 268, 273, 428/285, 418; 523/455; 525/486; 528/93

[56] References Cited

U.S. PATENT DOCUMENTS 3,849,492 11/1974 Brunetti et al. ................. 524/194 X
3,993,622 11/1976 Brunetti ............................. 524/194

FOREIGN PATENT DOCUMENTS 1593902 7/1981 United Kingdom .

OTHER PUBLICATIONS

J. P. Mitchell, T. L. Welsher, "Proceedings of the Printed Circuit World Convention II", vol. 1, Eugen G. Leuze Verlag, 1981.

*Primary Examiner*—Earl Nielsen
*Attorney, Agent, or Firm*—Kenyon & Kenyon

[57] ABSTRACT

Improved printed circuit boards of laminated thermosetting sheets with epoxy resin as the bonding agent contain for inhibiting copper migration 0.1% to 10% N,N'-bis-salicyloyl hydrazine, based on the weight of the hardened epoxy resin.

9 Claims, No Drawings

PRINTED CIRCUIT BOARDS OF LAMINATED THERMOSETTING SHEETS

BACKGROUND OF THE DISCLOSURE

This invention relates to printed circuit boards of laminated thermosetting sheets with epoxy resin as the bonding agent, as well as to a method for manufacturing such printed circuit boards. Printed (circuit) boards, especially multilayer printed boards, are the supporting base elements for wiring active and passive components. The operability of the printed board is, therefore, a decisive factor for the quality and reliability of integrated circuits and assemblies.

However, it must be noted that the operability of printed boards of the above-mentioned type is affected adversely by a process called copper migration. In that process copper bridges develop within relatively short times, particularly between through contacts and a circuitry layer potential position, which lead to a short and, therefore, to the failure of the corresponding assembly. These copper bridges are also called "conductive anodic filaments" (hereinafter CAF).

For the purpose of investigating the process of copper migration, laboratory methods have been developed in order to examine the formation of the filaments with time compression methods and, thereby, to find the causes for this process; and in addition to develop a process for determining the CAF proneness of different resin systems. Generally, test pieces are subjected here to a test voltage of about 100 V at elevated temperature and air humidity. In the printed boards predominantly used today of Class FR-4, having a base of glass fiber reinforced epoxy resins, for instance, the foregoing conditions lead to first failures after only a few days.

In practice, printed boards so damaged are rarely repaired since the short circuit bridges can be located only with difficulty. Rather in most cases the entire assembly is replaced, which generally is connected with significant costs. Inhibition of copper migration in printed boards therefore has increasing importance, especially with increasing minaturization and increased packing density, and, in addition, particularly with respect to the use of printed boards in humid places at elevated temperatures, for instance, in climatic zones associated with elevated moisture and heat.

The problem of copper migration in printed board materials of epoxide woven glass fabric laminate sheets, i.e., in printed boards of glass fiber reinforced epoxy resins has been known for years. Attempts at solving this problem have been concentrated to date on locating and testing CAF-resistant resin systems. In this connection, for instance, the use of reaction resins with a basis of triazines, bismaleimide-triazines (so-called BT resins) and polyimides instead of epoxy resins has been proposed. (See, J. P. Mitchell, T. L. Welsher in "Proceedings of the Printed Circuit World Convention II", vol. 1, pages 80 to 93, Eugen G. Leuze Verlag, 1981.) All systems with good CAF resistance such as, for instance, polyimides, however, have the disadvantage that they are substantially more expensive than epoxy resins. Since with improved semiconductor technology, the component costs drop and, hence, the share of the printed boards in the total cost of the assemblies is increasing, the use of resins of the type mentioned is not an economically sound solution to the problem of copper migration.

Thus, it is an object of this invention to provide high-quality and cost-effective printed boards with a basis of laminated thermosetting sheets with epoxy resins as the bonding agent, which have sufficient CAF resistance.

DETAILED DESCRIPTION OF THIS INVENTION

According to the invention, the foregoing objective is achieved by the provision that the printed boards contain about 0.1% to 10% N,N'-bis-salicyloyl hydrazine, by weight of the hardened epoxy resin.

Preferably the printed boards contain about 0.5% to 5%, N,N'-bis-salicyloyl hydrazine (hereinafter BSH). The BSH content given herein refers to the weight percent of BSH of the hardened epoxy resin, i.e., to the epoxy resin including hardener and, optionally, accelerator.

While N,N'-bis-salicyloyl hydrazine is known as a metal deactivator for polymers in contact with copper (British Pat. No. 1,593,902), it is entirely surprising, and could not be foreseen, that copper migration in printed boards of laminated thermosetting sheets, especially of epoxide woven glass fabric laminate sheets, could be inhibited effectively by BSH. This is because the processes of copper catalysis in the thermal-oxidative aging of polymers, particularly polyolefins, and those of copper migration in printed boards are basically different from each other. In the case of copper catalysis, copper ions are formed by oxidation of copper surfaces which can diffuse into the polymer in the form of carboxylates. Within relatively long periods of time, copper concentrations of maximally about $10^{-3}$ mol/kg polymer can become enriched in the polymer in the boundary layers near the copper. Since BSH is undissolved in the polymers and is not capable of migration, it intercepts the copper ions and deactivates them by sequestering through complex formation. If one starts with the commonly used deactivator concentration of 0.3% to 0.5% in the polymer, the copper ions which diffuse-in are faced by an at least 20 to 40 fold excess of complex former.

The situation in the process of copper migration in printed boards is entirely different, since here, massive copper filaments develop within a relatively short time (a few hundred hours). In tests of our own, filaments with a length of 275 $\mu$m and a diameter of 10 to 50 $\mu$m were found, for instance. In the formation of these filaments relatively large amounts of copper are transported in a very small volume according to a mechanism not known to date (for instance, in a volume of $2 \times 10^{-6}$ cm$^3$, up to 20 $\mu$g copper). On this transport path, copper is found in concentrations which are at least $10^3$ times larger than the concentration of the BSH. With an average BSH concentration of about 1% in the resin matrix, the inhibitor, i.e., the BSH would then have to diffuse-in from 2,000 times the volume in order to bind the copper transported during the copper migration. With the negligibly small solubility of BSH in epoxy resins, this is a very improbable process. It must, therefore, be assumed that the boundary surface between copper and epoxy resin is inactivated, i.e., barrier layers are built up on the copper surface and that the copper ions generated in the fabrication of the through-contact printed boards are bound during the fabrication process.

Printed boards are generally made in such a way that a fiber material which serves as a reinforcement is impregnated with a resin solution and the prepregs obtained thereby are processed further into laminated thermosetting sheets. In the manufacture of the printed boards according to the invention, N,N'-bis-salicyloyl-hydrazine is added to an epoxy resin solution. Suitable epoxy resins for use herein are aliphatic, cycloaliphatic and aromatic epoxides as well as their mixtures. Preferred for use herein are epoxy resins with a base of bisphenol-A-diglycidylether, bisphenol-F-diglycidylether as well as polydiglycidylethers of phenol/formaldehyde or cresol/formaldehyde novolak. Additional epoxy resins suitable for use herein are, for instance, 3,4-epoxycyclohexylmethyl-3',4'-epoxycyclohexane carboxylate, diglycidylesters of phthalic, isophthalic and terephthalic acid, as well as mixtures of these esters, hydrogenated bisphenol-A- or bisphenol-F-diglycidyl ethers, triglycidylisocyanurate, triglycidyl-p-aminophenol, tetraglycidyldiaminodiphenyl methane and tetraglycidyldiaminodiphenyl ether, as well as other epoxies which are described in "Handbook of Epoxy Resins" by Henry Lee and Kris Neville, McGraw-Hill Book Company, 1967, and in the monograph by Henry Lee "Epoxy Resins", American Chemical Society, 1970, which are incorporated herein by reference. The epoxy resins are hardened with hardeners such as dicyandiamide, optionally using basically acting hardening catalysts (accelerators), such as dimethylbenzylamine, i.e., converted into so-called epoxy moulded materials.

Glass fibers are preferably used as reinforcing material in the printed boards according to the invention, especially in the form of woven or nonwoven fabrics. In addition, however, woven or nonwoven fabrics of cellulose fibers can also be used.

The invention will be explained in further detail with the aid of embodiment examples.

EXAMPLE 96 g of a 16% nucleus brominated bisphenol-A-diglycidylether resin, 3.9 g dicyandiamide and 0.2 g dimethylbenzylamine are dissolved in a mixture of 40 ml cyclohexanone and 50 ml dimethylformamide. To this epoxy resin solution, different amounts of inhibitor (see the following table) are added in finely comminuted form (average particle size, 1 μm) and dispersed or dissolved with the aid of ultrasound by vigorous stirring. Through this resin solution, a woven glass fiber fabric (U.S. Style 2116, 30 cm wide) is drawn in an impregnating apparatus at a speed of 0.4 m/min, and the coated glass fiber fabric is dried free of solvent in a drying tower at temperatures of up to 160° C. The thickness of the coated glass fiber fabric (prepreg) is about 0.1 mm.

The coated glass fiber fabric is cut into pieces with a length of 40 cm each. Ten of these pieces are arranged in stacks between two copper foils 35 μm thick of the same size (30 cm×40 cm) used in the fabrication of printed boards, and pressed at a pressure of up to 25 bar and temperatures of up to 180° C. to form sheets which are copper clad on both sides, with a thickness of about 1 mm; in the process the epoxy resin is also hardened. After the copper surfaces are structured by means of a photo and etching technique, a stack of four prepregs and a further copper foil are pressed-on under the same conditions on the structured copper surface provided as the inner layer; the new copper surface obtained in the process is likewise structured. Then, the holes are generated and contacted through (holes plated by means of copper) so that test specimens are generated, the test points of which have a defined test spacing of 275 μm between the respective plated through hole and the inner circuitry layer. The test specimens are adjusted to a size of 110 mm×40 mm by stamping. Each test specimen contains 40 test points.

For testing, the test specimens are contacted and are subjected to a voltage of 100 V in an air-conditioning cabinet at 90° C. and 75% relative humidity. The insulation resistance between the plated through hole and the inner circuitry layer is measured. Test points, at which the resistance has dropped from the initial value measured under testing conditions to values of less than $10^5$ ohm are considered failures. By preparing polished sections, the development of copper filaments can be demonstrated at these test points.

In the Table the results are listed which were obtained with inhibitor-free test specimens as well as with test specimens containing inhibitor. BSH serves as inhibitor in different concentrations as well as, for comparison, N-salicyloyl-N'-salicylidene-hydrazine. It can be seen from the Table that the printed boards according to the invention are considerably superior to printed boards without the BSH and also to printed boards which contain a complex former known per se.

| Inhibitor | Number of Test Points | Number of Failures After | | |
|---|---|---|---|---|
| | | 150 h | 500 h | 1000 h |
| Without | 320 | 2 | 78 | 212 |
| 1% N—Salicyloyl-N'—salicylidene-hydrazine | 320 | 3 | 84 | 228 |
| 0.5% N,N'—Bis-salicyloyl-hydrazine | 320 | 0 | 0 | 0 |
| 1% N,N'—Bis-salicyloyl-hydrazine | 320 | 0 | 0 | 0 |
| 5% N,N'—Bis-salicyloyl-hydrazine | 320 | 0 | 0 | 0 |
| 10% N,N'—Bis-salicyloyl-hydrazine | 320 | 0 | 0 | 0 |

On the printed boards without inhibitor as well as on those with BSH as the inhibitor, the tests according to DIN 40802 or IEC 249 customary for printed boards were performed, such as checking the surface resistance, the bulk resistance, the loss factor at 1 MHz, the dielectric constant and the soldering resistance. The measured values obtained met in all cases the requirements, i.e., also for the printed boards containing the inhibitor.

What is claimed is:

1. A laminated thermosetting sheets based printed circuit board wherein the bonding agent of said printed board comprises an epoxy resin containing an amount of N,N'-bis-salicyloyl hydrazine effective to inhibit the formation of conductive anodic filaments in said printed board.

2. A printed circuit board of laminated thermosetting sheets wherein the bonding agent comprises an epoxy resin containing about 0.1% to about 10% N,N'-bis-salicyloyl hydrazine, by weight of the hardened epoxy resin, in said laminated printed board.

3. The printed board according to claim 2 wherein said N,N'-bis-salicyloyl hydrazine comprises about 0.5% to about 5% by weight of said hardened epoxy resin.

4. The printed board according to claim 2 wherein said printed board is reinforced by a woven or nonwoven glass fiber fabric.

5. The printed board according to claim 3 wherein said printed board is reinforced by a woven or nonwoven glass fiber fabric.

6. A method for preparing a prepreg suitable for use in the manufacture of a laminated thermosetting sheet based printed circuit board, wherein the bonding agent in said prepreg is prepared by the method comprising admixing an epoxy resin bonding agent and N',N'-bis-salicyloyl hydrazine, and hardening the resin, wherein said N,N'-bis-salicyloyl hydrazine comprises about 0.1% to about 10% by weight of the hardened epoxy resin.

7. The method according to claim 6 wherein said N,N'-bis-salicyloyl hydrazine comprises about 0.5% to about 5% by weight of said hardened epoxy resin.

8. The method according to claim 6 wherein said printed board is glass fiber reinforced.

9. The method according to claim 6 wherein the epoxy resin comprises bisphenol-A-diglycidylether, bisphenol-F-diglycidylether or polydiglycidylethers of phenol/formaldehyde or cresol/formaldehyde novolak.

* * * * *